United States Patent
Zhao et al.

(10) Patent No.: US 12,104,076 B2
(45) Date of Patent: Oct. 1, 2024

(54) COATING FOR ANTI-FOULING AND ANTI-CORROSION ON METALS

(71) Applicant: The Board of Trustees of the University of Illinois, Urbana, IL (US)

(72) Inventors: Hanyang Zhao, Champaign, IL (US); Nenad Miljkovic, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 708 days.

(21) Appl. No.: 17/179,805

(22) Filed: Feb. 19, 2021

(65) Prior Publication Data
US 2021/0269671 A1    Sep. 2, 2021

Related U.S. Application Data

(60) Provisional application No. 62/983,294, filed on Feb. 28, 2020.

(51) Int. Cl.
| | |
|---|---|
| C09D 183/04 | (2006.01) |
| C23C 14/02 | (2006.01) |
| C23C 14/10 | (2006.01) |
| C23C 14/34 | (2006.01) |
| C25D 13/02 | (2006.01) |

(52) U.S. Cl.
CPC .......... *C09D 183/04* (2013.01); *C23C 14/021* (2013.01); *C23C 14/10* (2013.01); *C23C 14/34* (2013.01); *C25D 13/02* (2013.01)

(58) Field of Classification Search
None
See application file for complete search history.

(56) References Cited

U.S. PATENT DOCUMENTS

| | | | | |
|---|---|---|---|---|
| 2010/0181052 A1* | 7/2010 | Burgers | ................ | F28D 9/0018 165/164 |
| 2015/0175814 A1* | 6/2015 | Aizenberg | ........... | C09D 5/1693 427/2.24 |
| 2017/0062537 A1* | 3/2017 | Kim | ..................... | H10K 59/123 |
| 2019/0181069 A1* | 6/2019 | Rykaczewski | ........ | B32B 27/283 |

OTHER PUBLICATIONS

Anand et al. "Enhanced Condensation on Lubricant-Impregnated Nanotextured Surfaces," *ACS Nano*, 6, 11 (2012) pp. 10122-10129.
Aparicio et al. "Corrosion Protection of AISI 304 Stainless Steel with Melting Gel Coatings," *Electrochimica Acta*, 202 (2016) pp. 325-332.
Awais et al., "Recent Advancements in Impedance of Fouling Resistance and Particulate Depositions in Heat Exchangers," *International Journal of Heat and Mass Transfer*, 141 (2019) pp. 580-603.
Aqra et al., "Surface Energies of Metals in Both Liquid and Solid States," *Applied Surface Science*, 257 (2011) pp. 6372-6379.
Azimi et al., "Scale-Resistant Surfaces: Fundamental Studies of the Effect of Surfaceenergy on Reducing Scale Formation," *Applied Surface Science*, 313 (2014) pp. 591-599.
Bargir et al., "The Use of Contact Angle Measurements to Estimate the Adhesion Propensity of Calcium Carbonate to Solid Substrates in Water," *Applied Surface Science*, 255 (2009) pp. 4873-4879.
Boyina et al., Condensation Frosting on Meter-Scale Superhydrophobic and Superhydrophilic Heat Exchangers, *International Journal of Heat and Mass Transfer*, 145, 118694 (2019) pp. 1-13.
Camino et al., "Polydimethylsiloxane Thermal Degradation Part 1. Kinetic Aspects," *Polymer*, 42 (2001) pp. 2395-2408.
Castro et al., "Coatings Produced by Electrophoretic Deposition from Nano-Particulate Silica Sol-Gel Suspensions," *Surface and Coatings Technology*, 182 (2004) pp. 199-203.
Castro et al., "Corrosion Behaviour of Silica Hybrid Coatings Produced from Basic Catalysed Particulate Sols by Dipping and EPD," *Surface & Coatings Technology*, 191 (2005) pp. 228-235.
Cha et al., "Dropwise Condensation on Solid Hydrophilic Surfaces," *Sci. Adv.* 2020, 6, eaax0746 (Jan. 10, 2020) pp. 1-7.
Chavan et al., "Effect of Latent Heat Released by Freezing Droplets During Frost Wave Propagation," *Langmuir*, 34 (2018) pp. 6636-6644.
Curan et al., "The Thermal Conductivity of Plasma Electrolytic Oxide Coatings on Aluminium and Magnesium," *Surface & Coatings Technology*, 199 (2005) pp. 177-183.
Deegan et al., "Capillary Flow as the Cause of Ring Stains from Dried Liquid Drops," *Nature*, 389 (1997) pp. 827-829.
Denkov et al., "Two-Dimensional Crystallization," *Nature*, 361 (1993) pp. 26.
Edwards, "Cracking Deposition Behavior of Supercritical Hydrocarbon Aviation Fuels," *Combustion Science and Technology*, 178, 1-3 (2007) pp. 307-334.
Forsberg et al., "Cassie-Wenzel and Wenzel-Cassie Transitions on Immersed Superhydrophobic Surfaces Under Hydrostatic Pressure," *Soft Matter*, 7, 104 (2011) pp. 104-109.
Förster et al., Modification of Molecular Interactions at the Interface Crystal/heat Transfer Surface to Minimize Heat Exchanger Fouling,*Int. J. Therm. Sci.* 39 (2000) pp. 697-708.
Fritzmann et al. "State-of-the-art of reverse osmosis desalination," *Desalination*, 216 (2007) pp. 1-76.
Ge et al., "Thermal Conductance of Hydrophilic and Hydrophobic Interfaces," *Phys. Rev. Letters*, 96, 186101 (2006) pp. 1-4.
Gill, "A Novel Inhibitor for Scale Control in Water Desalination," *Desalination*, 124 (1999) pp. 43-50.
Gudmundsson et al., "Online Fouling Detection of Domestic Hot Water Heat Exchangers," *Heat Transfer Engineering*, 37, 15 (2016) pp. 1231-1241.

(Continued)

*Primary Examiner* — Cheng Yuan Huang
(74) *Attorney, Agent, or Firm* — Crowell & Moring LLP

(57) ABSTRACT

A coated substrate that may exhibit anti-scaling properties includes a substrate comprising a metal or alloy, an intermediary layer formed on the substrate, and a non-crosslinked omniphobic coating formed on the intermediary layer. A method of forming an anti-scaling coating on a substrate includes forming an intermediary layer on a substrate comprising a metal or alloy, and forming a non-crosslinked omniphobic coating on the intermediary layer.

12 Claims, 7 Drawing Sheets
(2 of 7 Drawing Sheet(s) Filed in Color)

(56) References Cited

OTHER PUBLICATIONS

Günay et al., "Steady Method for the Analysis of Evaporation Dynamics," Langmuir 33 (2017) pp. 12007-12015.
Holmes et al., "Fabrication of Buried Channeled Waveguides on Silicon Substrates Using Spin on Glass," Applied Optics, 32, 25 (1993) pp. 4916-4921.
Hoyas et al., "Effect of Surface Reactive Site Density and Reactivity on the Growth of Atomic Layer Deposited WN$x$C$y$ Films," *Electrochemical and Solid-State Letters*, 9 (2006), pp. F64-F68.
Jafari et al., "Fabrication of Superhydrophobic Nanostructured Surface on Aluminum Alloy," *Appl Phys A*, 102 (2011) pp. 195-199.
Jones et al., "Quantitative Evaluation of Jet-Fuel Fouling and the Effect of Additives," *Energy & Fuels*, 9 (1995) pp. 906-912.
Karthika et al., "A Review of Classical and Nonclassical Nucleation Theories," Crystal Growth & Design, 16 (2016) pp. 6663-6681.
Kho et al., "Effect of Flow Distribution on Scale Formation in Plate and Frame Heat Exchangers," *Trans IChemE*, 75, A (1997) pp. 635-640.
Kishida et al., "Preparation of Thick Silica Films by Combined Sol-Gel and Electrophoretic Deposition Methods," *Journal of the Ceramic Society of Japan*, 102, 4 (1994) pp. 336-340.
Kohl et al. "Low $k$, Porous Methyl Silsesquioxane and Spin-On-Glass," *Electrochemical and Solid-State Letters*, 2, 2 (1999) pp. 77-79.
Kreder et al., "Film Dynamics and Lubricant Depletion by Droplets Moving on Lubricated Surfaces," *Phys. Rev. X*, 8 (2018) pp. 031053-1-031053-16.
Lafuma et al., "Slippery pre-suffused surfaces," *EPL*, 96 (2011) pp. 56001-1-56001-4.
Lee, "Correlation between Lewis Acid-Base Surface Interaction Components and Linear Solvation Energy Relationship Solvatochromic $\alpha$ and $\beta$ Parameters," *Langmuir*, 12 (1996) pp. 1681-1687.
Liu et al., "Effect of viscosity ratio on the shear-driven failure of liquidinfused Surfaces," *Phys. Rev. Fluids*, 1, 0740003 (2016), pp. 1-24.
Maroo et al., "Heat Transfer Characteristics and Pressure Variation in a Nanoscale Evaporating Meniscus," *International Journal of Heat and Mass Transfer*, 53 (2010) pp. 3335-3345.
Masoudi et al., Antiscaling Magnetic Slippery Surfaces, Applied Materials & Interfaces, 9 (2017) pp. 21025-21033.
Matsui et al., "Room Temperature Replication in Spin on Glass by Nanoimprint Technology," *J. Vac. Sci. Technol. B*, 19, 6 (2001) pp. 2801-2805.
Müller-Steinhagen et al., "Fouling of Heat Exchangers-New Approaches to Solve an Old Problem," *Heat Transfer Engineering*, 26, 1 (2005) pp. 1-4.
Nishimori et al., "Preparation of Thick Silica Films by the Electrophoretic Sol-Gel Deposition on a Stainless Steel Sheet," *Journal of the Ceramic Society of Japan*, 103, 1 (1985) pp. 78-80.
Panchal et al., "Mitigation of Water Fouling: Technology Status and Challenges," *Advances in Heat Transfer*, 31 (1998) pp. 431-474.
Plawski et al. "Nano- and Microstructures for Thin-Film Evaporation—A Review," *Nanoscale and Microscale Thermophysical Engineering*, 18 (2014) pp. 251-269.
Poli et al. "Does low hydroxyl group surface density explain less bacterial adhesion on porous alumina?," *Orthopaedics & Traumatology: Surgery & Research*, 105 (2019) pp. 473-477.
Preston et al., "Effect of Hydrocarbon Adsorption on the Wettability of Rare Earth Oxide Ceramics," *Appl. Phys. Lett.*, 105 (2014) pp. 011601-1-011601-5.
Reed et al., "Ultrascalable Multifunctional Nanoengineered Copper and Aluminum for Antiadhesion and Bactericidal Applications," *ACS Appl. Bio Mater.*, 2 (2019) pp. 2726-2737.
Sear, "Nucleation: Theory and Applications to Protein Solutions and Colloidal Suspensions," *J. Phys.: Condens. Matter*, 19, 033101 (2007) pp. 1-29.
Sett et al. "Stable Dropwise Condensation of Ethanol and Hexane on Rationally Designed Ultrascalable Nanostructured Lubricant-Infused Surfaces," *Nano Lett.*, 19 (2019) pp. 5287-5296.
Sheikholeslami et al., "Scaling of Plain and Externally Finned Heat Exchanger Tubes," *Journal of Heat Transfer*, 108 (1986), pp. 147-152.
Shi et al., "A Facile and Mild Route for Fabricating Slippery Liquid-Infused Porous Surface (SLIPS) on CuZn with Corrosion Resistance and Self-Healing Properties," *Surface & Coatings Technology*, 330 (2017) pp. 102-112.
Steinhagen et al., "Problems and Costs due to Heat Exchanger Fouling in New Zealand Industries," *Heat Transfer Engineering*, 14, 1 (1993) pp. 19-30.
Subramanyam et al., "Designing Lubricant-Impregnated Textured Surfaces to Resist Scale Formation," *Adv. Mater. Interfaces*, 1, 1300068 (2014) pp. 1-6.
Wong et al., "Bioinspired Self-Repairing Slippery Surfaces with Pressure-Stable Omniphobicity," *Nature*, 477 (2011) pp. 443-447.
Tamura et al., "Surface Hydroxyl Site Densities on Metal Oxides as a Measure for the Ion-Exchange Capacity," *Journal of Colloid and Interface Science*, 209, (1999) pp. 225-231.
Van Oss, "Interfacial Lifshitz-van der Waals and Polar Interactions in Macroscopic Systems," *Chem. Rev.* 88 (1988) pp. 927-941.
Vazirian et al., "Surface in Organic Scale Formation in Oil and Gas Industry: As Adhesion and Deposition Processes," *Journal of Petroleum Science and Engineering*, 137 (2016) pp. 22-32.
Wang et al., "Covalently Attached Liquids: Instant Omniphobic Surfaces with Unprecedented Repellency," *Angew. Chem. Int. Ed.*, 55 (2016) pp. 244-248.
Wang et al., "Fabrication of Slippery Lubricant-Infused Porous Surface for Inhibition of Microbially Influenced Corrosion," *ACS Appl. Mater. Interfaces*, 8 (2016) pp. 1120-1127.
Wang et al., "Robust Superhydrophobic Coating and the Anti-Icing Properties of its Lubricants-Infused Composite Surface Under Condensing Condition," *New J. Chem.*, 41 (2017) pp. 1846-1853.
Watkinson et al., "Scaling of Heat Exchanger Tubes by Calcium Carbonate," *Transaction of the ASME*, Nov. 1975, pp. 504-508.
Weisensee et al., "Condensate Droplet Size Distribution on Lubricant-Infused Surfaces," *Int. J. Heat Mass Transfer*, 109 (2017) pp. 187-199.
Wohlwend et al., "Thermal Stability of Energetic Hydrocarbon Fuels for Use in Combined Cycle Engines," *Journal of Propulsion and Power*. 17, 6 (2001) pp. 1258-1262.
Xiao et al., "Negative Pressures in Nanoporous Membranes for Thin Film Evaporation," *Appl. Phys. Lett.*, 102 (2013) pp. 123103-1-123103-4.
Yan et al., "Droplet Jumping: Effects of Droplet Size, Surface Structure, Pinning, and Liquid Properties," *ACS Nano*, 13 (2019) pp. 1309-1323.
Yan et al., "Atmosphere-Mediated Superhydrophobicity of Rationally Designed Micro/Nanostructured Surfaces," *ACS Nano*, 13 (2019) pp. 4160-4173.
Yunker et al., "Suppression of the coffee-ring effect by shape-dependent capillary interactions," *Nature*, 476 (2011), pp. 308-311.
Zahn et al., "Experimental investigation on particle deposition characteristics of wavy fin-and-tube heat exchangers," *Applied Thermal Engineering*, 99 (2016) pp. 1039-1047.
Zheng et al., "Effects of Hydraulic Pressure on the Stability and Transition of Wetting Modes of Superhydrophobic Surfaces," *Langmuir*, 21, (2005) pp. 12207-12212.
Zhuravlev et al., "Concentration of Hydroxyl Groups on the Surface of Amorphous Silicas," *Langmuir*, 3 (1987) pp. 316-318.

* cited by examiner

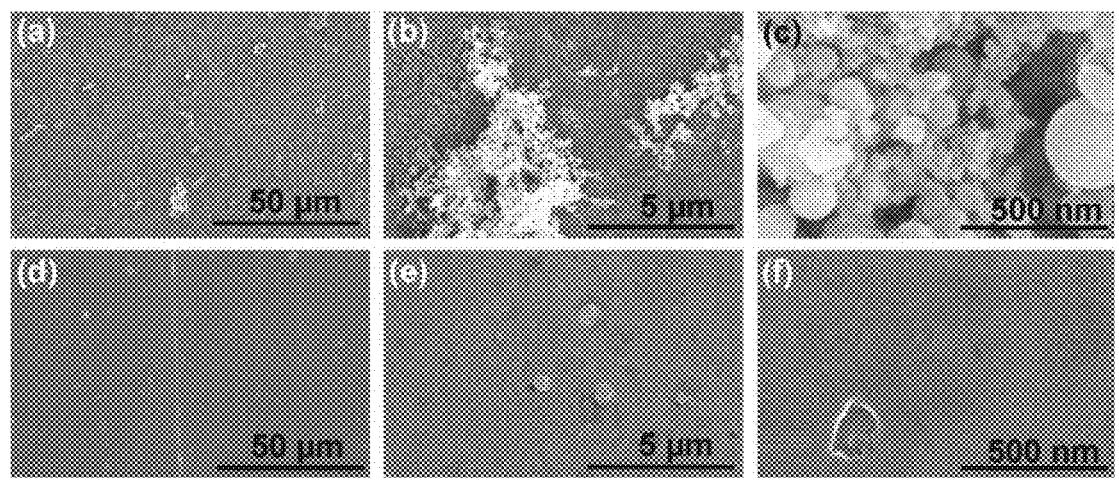
FIGS. 3A-3F
FIG. 4A  FIG. 4B
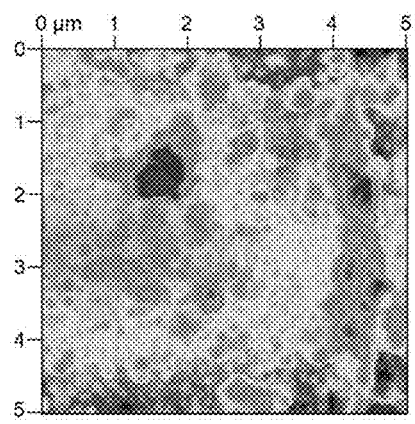
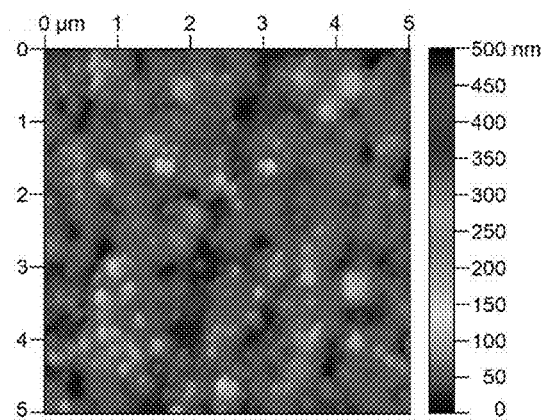
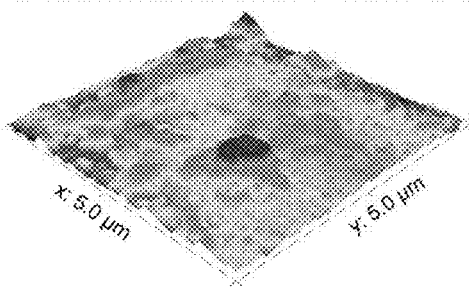
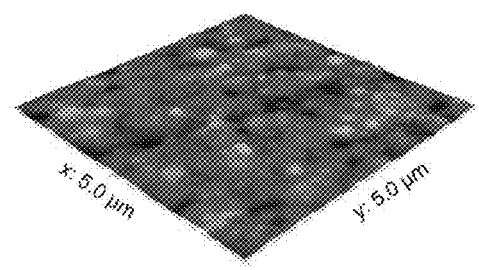
FIG. 4C  FIG. 4D FIG. 7A
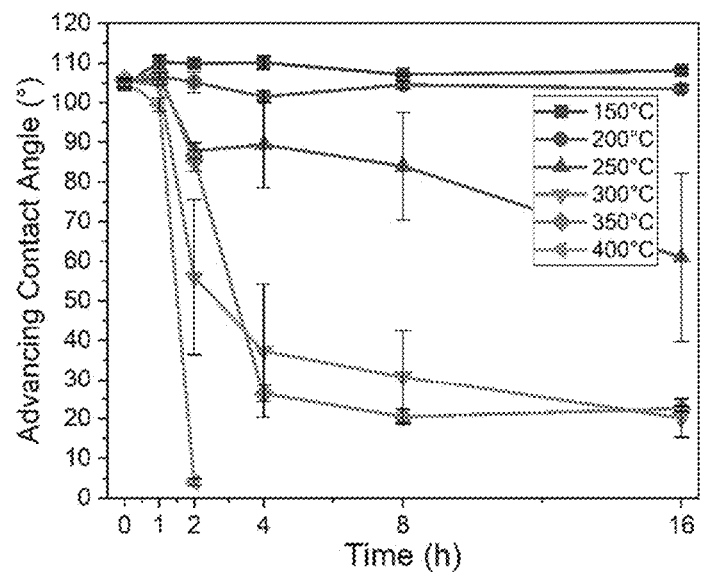
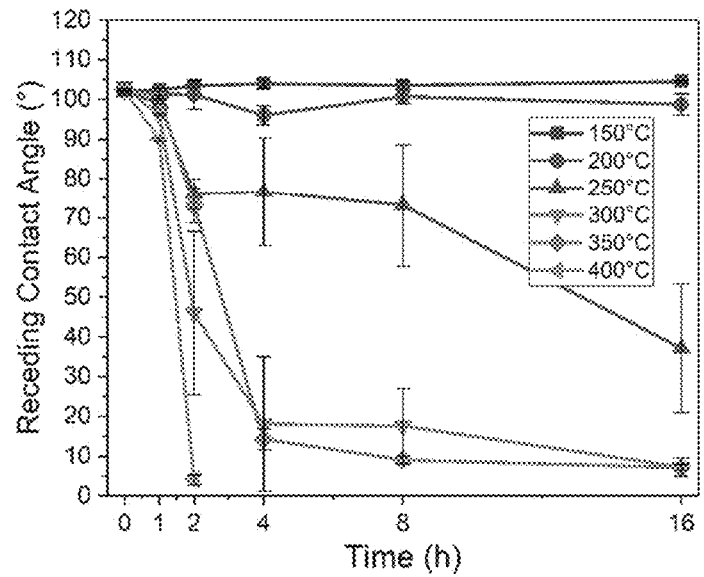
FIG. 7B

000000
COATING FOR ANTI-FOULING AND ANTI-CORROSION ON METALS

RELATED APPLICATION

The present patent document claims the benefit of priority under 35 U.S.C. § 119(e) to U.S. Provisional Patent Application No. 62/983,294, which was filed on Feb. 28, 2020, and is hereby incorporated by reference in its entirety.

FEDERALLY SPONSORED RESEARCH OR DEVELOPMENT

This invention was made with government support under DE-EE0008312 awarded by the Department of Energy. The government has certain rights in the invention.

TECHNICAL FIELD

The present disclosure is related generally to coating structures and methods, and more specifically to a coated substrate designed to resist scaling, fouling, and/or corrosion.

BACKGROUND

Scaling is a major unresolved problem in a variety of industries including water treatment and power generation. One of the main applications where scaling is encountered is in heat transfer equipment. Thermal systems and components, such as boilers, steam generators, and evaporators, can encounter significant fouling due to scale formation near regions of phase transition and high supersaturation. In heat exchangers, accumulation of salt scale on surfaces can lead to decreased heat transfer, increased corrosion, and increased pressure drop, resulting in higher operational costs and shortened equipment lifetime. The added operational costs for active scale removal, such as mechanical abrasion and chemical inhibition, may account for 0.25% of the gross domestic product and 2.5% of the $CO_2$ emissions in industrialized nations. In the past few decades, an emphasis has been placed on developing techniques to enable scale mitigation. These efforts have mostly focused on improving the efficiency of mechanical and chemical removal techniques.

BRIEF SUMMARY

A coated substrate that may exhibit anti-scaling properties includes a substrate comprising a metal or alloy, an intermediary layer formed on the substrate, and a non-crosslinked omniphobic coating formed on the intermediary layer.

A method of forming an anti-scaling coating on a substrate includes forming an intermediary layer on a substrate comprising a metal or alloy, and forming a non-crosslinked omniphobic coating on the intermediary layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 3A-3F show comparison scanning electron microscopy (SEM) images of $SiO_2$ intermediary layers deposited on aluminum substrates by electrophoretic deposition (EPD), where in FIGS. 3A-3C deposition utilizes a conventional coating solution and in FIGS. 3D-3F deposition utilizes a modified coating solution that leads to a significant decrease in surface roughness.

FIGS. 4A and 4C show atomic force microscopy (AFM) images of the $SiO_2$ intermediary layer of FIGS. 3A-3C.

FIGS. 4B and 4D show AFM images of the $SiO_2$ intermediary layer of FIGS. 3D-3F.

FIGS. 7A and 7B show results of thermal stability tests on the coated substrates, in particular, advancing contact angle versus time and receding contact angle versus time, respectively, for a range of temperatures.

DETAILED DESCRIPTION

A coated substrate that may exhibit anti-scaling, anti-fouling and/or anti-corrosion properties, and a method of making such a coated substrate, is described in this disclosure. The coated substrate may form part or all of a heat exchanger or other thermal component, which may be used in water treatment, power generation, or another industrial application. Because the coated substrate is engineered to resist scaling, any scale that may be deposited in use can be readily removed (e.g., by rinsing with water).

Figure 1:
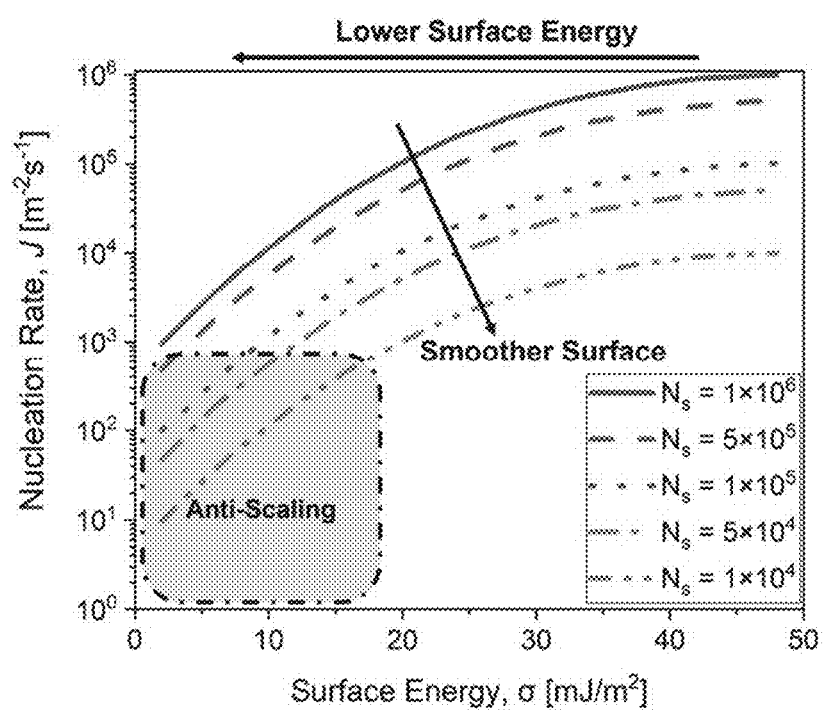
FIG. 1 shows simulation results illustrating the relationship between the nucleation rate of scale on a surface as a function of surface energy for different nucleation site densities.

According to classical nucleation theory, lowering the surface energy of a substrate increases the energy barrier for heterogeneous nucleation on the substrate, and thus leads to delayed salt scaling or fouling. Furthermore, surfaces that are rendered ultra- or atomically smooth provide fewer sites for heterogeneous nucleation, also leading to reduced scaling rates. These trends are shown in FIG. 1, which illustrates simulation results showing the heterogeneous nucleation rate (J) of scale on a surface as a function of substrate surface energy (σ) for different nucleation site densities (Ns). As the surface energy reduces and surface topology become smoother, J decreases. The bottom-left corner represents a qualitative region for identifying parameters that may result in reduced scaling or nucleation behavior. Accordingly, the coated substrates described in this disclosure are uniquely designed to exhibit extremely low surface energies and surface roughness, as well as good durability.

Figure 2A:
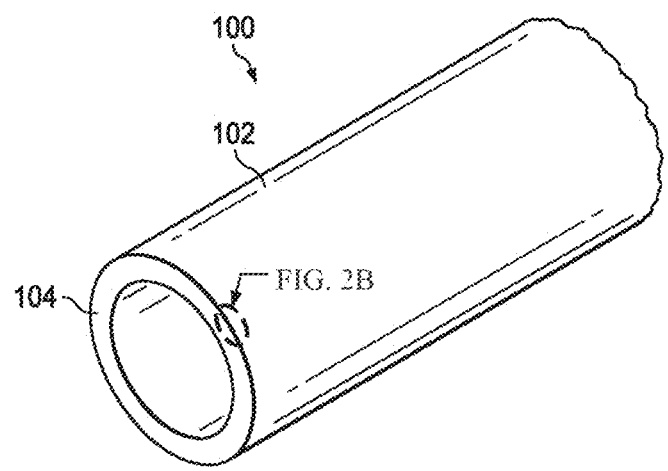
FIG. 2A shows an industrial component including a coated substrate as described herein.
Figure 2B:
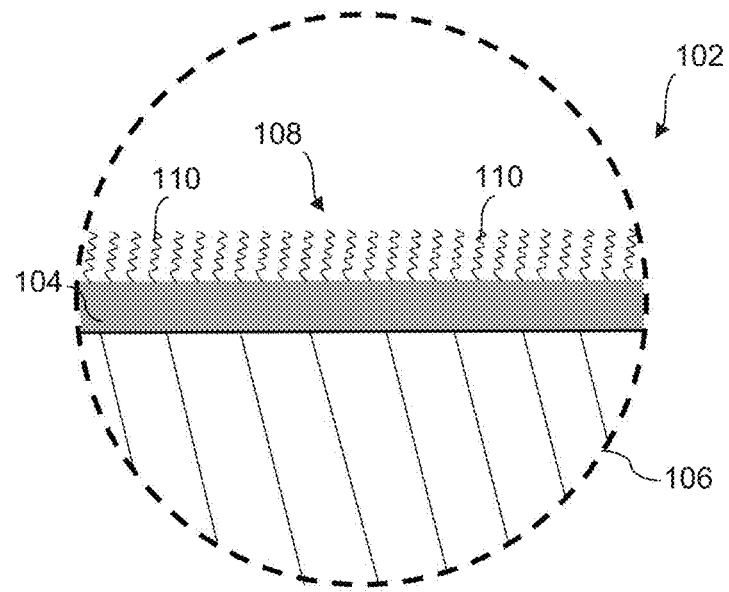
FIG. 2B is a transverse cross-sectional schematic showing part of the coated substrate of FIG. 2A.

FIG. 2A shows an exemplary coated substrate 102 that may form part or all of a heat exchanger (e.g., evaporator, condenser, boiler) or other thermal component 100. In this example, the component 100 has a tubular shape; however, the component 100 is not limited to this geometry and may have any shape suitable for the intended application. Referring to FIG. 2B, which shows a transverse cross-sectional view (not to scale) of part of the coated substrate 102, it can be seen that an intermediary layer 104 is disposed on a substrate 106 comprising a metal or alloy, and a non-crosslinked omniphobic coating 108 is disposed on the intermediary layer 104.

The non-crosslinked omniphobic coating 108 is configured to repel most or all liquids and is thus referred to as "omniphobic." Such non-crosslinked omniphobic coatings 108 may comprise single chain polymers 110 of short lengths (e.g., 3-6 nm) directly attached to an underlying layer (the intermediary layer 104) without any interlinking or crosslinking, as illustrated in FIG. 2B. In one example, the non-crosslinked omniphobic coating 108 may comprise non-crosslinked polydimethylsiloxane (PDMS). The non-crosslinked omniphobic coating 108 may be referred to as a slippery omniphobic covalently attached liquid (SOCAL) coating due to its liquid-like behavior and low surface energy. Accordingly, the term "SOCAL" coating may be used interchangeably in this disclosure with "non-crosslinked omniphobic" coating.

The metal or alloy of the substrate 106 is preferably highly thermally conductive while also providing the mechanical and/or chemical properties required for the application. Typically, the metal or alloy comprises aluminum, copper, stainless steel, titanium, nickel, and/or a nickel-base superalloy, but is not limited to these metals and alloys.

The intermediary coating 104 is beneficially applied to facilitate attachment of the non-crosslinked omniphobic coating 108 to the metallic substrate 106. The inventors recognized the importance of providing a high density of hydroxyl groups on the substrate 106 for attachment to the non-crosslinked omniphobic coating 108 when deposition of the coating directly onto an aluminum alloy substrate posed challenges. In particular, it was hypothesized that the difference in hydroxyl group density of clean $SiO_2$ interfaces compared to AlO(OH) interfaces may significantly impact coating attachment. Thus, the intermediary layer 104 typically comprises a glass or $SiO_2$ (silica). It is postulated that other oxides, such as alumina, may also be suitable. The intermediary layer 104 is preferably amorphous.

The non-crosslinked omniphobic coating 106 may have a nanoscale thickness which is typically two to three orders of magnitude smaller than that of the intermediary layer 104. For example, the thickness of the non-crosslinked omniphobic coating 106 may lie in a range from about 1 nm to about 10 nm, or from about 4 nm to about 6 nm. The thickness of the intermediary layer 104 can be adjusted during fabrication and may not have a significant impact on the thermal properties of the coated substrate 102. Typically, the thickness of the intermediary layer 104 lies in a range from about 0.5 micron to about 4 microns, and may also be in the range from about 0.5 micron to about 0.9 micron.

As indicated above, the coated substrate 102 is preferably engineered to exhibit a low surface energy and surface roughness. Scanning electron microscopy (SEM) and atomic force microscopy (AFM) images discussed below demonstrate the exceptional smoothness of the intermediary layers 104 on the substrates 106. For example, the intermediary layer 104 may have a root mean square roughness ($R_q$) of about 50 nm or less, and preferably about 25 nm or less. In some examples, it is possible to fabricate ultra-smooth intermediary layers 104 exhibiting values of $R_q$ of about 5 nm or less, or even about 1 nm or less.

Figure 5:
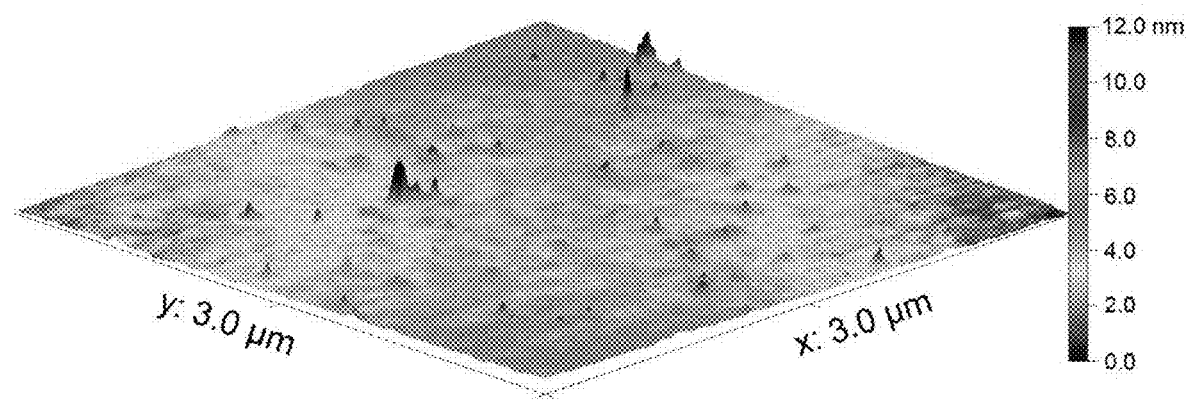
FIG. 5 shows an AFM image of a $SiO_2$ intermediary layer 104 deposited on a copper substrate 106 by dip coating, where measurements show a root mean square (RMS) roughness of less than 1 nm.

The smoothness of the intermediary layer 104 may depend in part on how the layer 104 is fabricated and/or the coating solution composition. FIGS. 3A-3F show comparison SEM images of $SiO_2$ intermediary layers 104 deposited on aluminum substrates 106 by electrophoretic deposition (EPD), where in FIGS. 3A-3C deposition is carried out using a conventional coating solution and in FIGS. 3D-3F deposition is carried out using a modified coating solution (described below) that results in improved smoothness. Similarly, the AFM images of FIGS. 4A and 4C show the $SiO_2$ intermediary layer 104 formed by EPD using the conventional coating solution, and the AFM images of FIGS. 4B and 4D show the $SiO_2$ intermediary layer 104 formed by EPD using the modified coating solution. As is apparent upon comparing the images, use of the conventional coating solution for EPD results in an uneven surface with many random aggregations of $SiO_2$ particles, whereas EPD with the modified coating solution results in a smoother surface with reduced roughness. In particular, FIGS. 4A and 4C show a surface having a clear aggregation of $SiO_2$ particles present and a peak-to-valley roughness approaching 400 nm, whereas FIGS. 4B and 4D reveal a much smoother surface, with no aggregations observed, and a reduced roughness of <50 nm. Dip coating may provide even smoother surfaces. FIG. 5 shows an AFM image of a $SiO_2$ intermediary layer 104 deposited on a copper substrate by dip coating, where features in the z-axis are enlarged by 10 times. A detailed scan over a 0.73 μm×2.16 μm area reveals an exceptionally low root mean square roughness for the intermediary layer 104 (e.g., $R_q$=0.9 nm).

Lifshitz-van der Waals (LW) theory is employed as described in the priority patent application, which is incorporated by reference as stated above, to demonstrate an extremely low surface energy of about 11 $mJ/m^2$ for the non-crosslinked omniphobic coating 108, which suggests a high anti-scaling potential for the coated substrate 102. For comparison, Table 1 provides surface energy values of common metals and polymers, as reported in previous studies. Generally speaking, the non-crosslinked omniphobic coating 108 may have a low surface or interfacial energy of about 15 $mJ/m^2$ or less, e.g., from about 9 $mJ/m^2$ to about 13 $mJ/m^2$.

TABLE 1

Surface Energies of Common Metals and Polymers in Comparison with the Coating

| Material | Surface Energy [$mJ/m^2$] |
|---|---|
| Cu | 1830 |
| Al | 1160 |
| Fe | 2480 |
| PDMS | 20 |
| Kapton ® | 50 |
| Polyethylene | 31 |
| Uncoated glass | 52 |
| Methylsilane | 48 |
| Dimethylsilane | 26 |
| SOCAL | 11 1.5 |

Due to the exceptional smoothness and low surface energy, the coated substrate 102 may exhibit a contact angle hysteresis of about 5° or less, or preferably about 3° or less (e.g., with respect to water at room temperature). Contact angle hysteresis is defined as the difference between the apparent advancing and receding contact angles. Wettability data are provided in Table 2 below, which also summarizes the anti-scaling properties of exemplary coated substrates 102 in comparison with other types of coated and uncoated surfaces. Anti-scaling tests are carried out as described below using $CaSO_4$ and $CaCO_3$.

In Table 2, sample (a) refers to a silicon substrate with a non-crosslinked omniphobic (or SOCAL) coating; (b) refers to an uncoated silicon substrate; (c) refers to a glass substrate coated with a non-crosslinked omniphobic coating; (d) refers to an uncoated aluminum substrate; (e) refers to an aluminum substrate coated with a $SiO_2$ intermediary layer (by EPD using the modified coating solution) followed by the non-crosslinked omniphobic coating; (f) refers to an aluminum substrate coated with a $SiO_2$ intermediary layer (by EPD using the original coating solution) followed by the non-crosslinked omniphobic coating; (g) refers to an aluminum substrate coated with a $SiO_2$ intermediary layer (by physical vapor deposition (PVD)) followed by the non-crosslinked omniphobic coating; (h) refers to an aluminum substrate including a hexadecyltrimethoxysilane (HTMS) superhydrophobic coating; and (i) refers to a copper substrate including a lubricant-infused surface. The different coating methods (e.g., EPD, PVD) are discussed below. Only samples having both a smooth surface and low surface energy (SE) coating (i.e., samples (a), (c), (e), (g) and (i)) exhibit anti-scaling performance.

TABLE 2

Tilted sample scaling test results and contact angle characterization

| Sample Name | Sample Description | ACA [°] | RCA [°] | Contact Angle Hysteresis [°] | Wt. Added (Al Sample) | Wt. Added [mg/cm²] |
|---|---|---|---|---|---|---|
| (a) Si SOCAL | Smooth Low SE | 104.7 ± 0.5 | 103.5 ± 0.4 | 1.05 ± 0.6 | N/A | 0.012 |
| (b) Si Uncoated | Smooth High SE | 43.4 ± 0.4 | 30.8 ± 0.7 | 12.6 ± 0.8 | N/A | 0.190 |
| (c) Glass SOCAL | Smooth Low SE | 108.3 ± 0.6 | 103.9 ± 0.5 | 4.4 ± 0.8 | N/A | 0.018 |
| (d) Al Uncoated | Smooth High SE | 7.8 ± 2.6 | ≈0 | 7.8 ± 2.6 | 1.73‰ | 0.735 |
| (e) Al EPD SiO₂ New | Smooth Low SE | 105.5 ± 1.0 | 102.8 ± 0.6 | 2.7 ± 1.2 | 0.09‰ | 0.036 |
| (f) Al EPD SiO₂ Old | Rough Low SE | 129.7 ± 0.9 | 90.4 ± 2.6 | 39.3 ± 2.8 | 2.48‰ | 0.912 |
| (g) Al PVD SiO₂ | Smooth Low SE | 103.9 ± 1.1 | 95.4 ± 1.2 | 8.5 ± 1.6 | 0.23‰ | 0.097 |
| (h) Al HTMS SHP | Rough Low SE | 170.4 ± 1.4 | 165.4 ± 4.1 | 5.0 ± 4.3 | 1.16‰ | 0.488 |
| (i) Cu LIS | Smooth Low SE | 121.5 ± 1.7 | 118.5 ± 2.4 | 3.0 ± 2.9 | N/A | 0.028 |

Figures 6A, 6B, 6C, 6D, 6E, 6F:
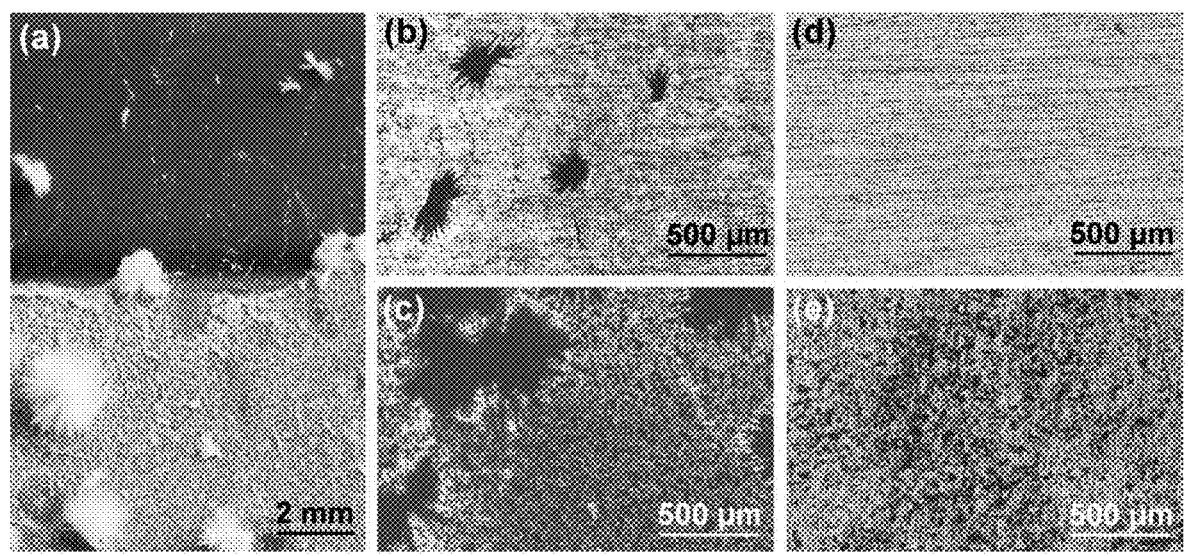
FIGS. 6A-6C are optical microscopy images showing results of scaling tests on SOCAL-coated and uncoated areas of a $SiO_2$-coated aluminum substrate.
FIGS. 6D and 6E are optical microscopy images showing results of water washing of coated and uncoated substrates, respectively, with amorphous salt remaining on the uncoated side after washing.

The scaling tests show that the pattern of salt formation on the samples is quite different depending on the coating utilized. Referring to FIG. 6A, both the pattern and the amount of salt scale dramatically differ on the SOCAL-coated and uncoated areas of an EPD $SiO_2$-coated aluminum substrate. The size of the crystallized salt is much smaller on the SOCAL coated side (top half of FIG. 6A), where few amorphous salt particles reside. On the uncoated side (bottom half of FIG. 6A), the surface is covered with amorphous salt precipitates and a large crystallized salt. The differing scale morphology is further verified with optical microscopy as shown in FIGS. 6B and 6C. On the SOCAL-coated side (FIG. 6B), other than small salt crystals, the aluminum substrate can be seen through the EPD $SiO_2$ coating, whereas the uncoated area (FIG. 6C) is covered with amorphous salt crystals. In addition to morphology and scale density, the two different types of salt formation vary widely in their adhesion to the substrate. When squeezing a bottle of DI water to wash the dried samples after fouling tests, the large crystallized salt is quite easy to remove, both on the SOCAL-coated and uncoated areas. The amorphous salt is much harder to remove. The results of DI water washing are shown in FIGS. 6D and 6E, which show optical microscopy images of a scaled area after washing, with stubborn amorphous salt remaining (only) on the uncoated side (FIG. 6E).

The experiments show that the nucleation process of salt on the coated and uncoated substrates is fundamentally different. The low surface energy SOCAL coating mitigates nucleation. The amorphous salt evenly covers the uncoated substrate, indicating a higher nucleation rate when compared to the SOCAL-coated side. Since the samples are kept flat at the bottom of the scaling solution during the experiments, prior to all water evaporating no concentration difference exists across the sample. The scaling tests demonstrate a 95% reduced scaling rate when compared to bare polished metal (e.g., aluminum) surfaces. The results are a clear demonstration of the anti-scaling nature of the coated substrates 102 described in this disclosure. Furthermore, the tests reveal that the coated substrates 102 have enhanced de-scaling rates compared to untreated polished metal surfaces due to the ultra-low adhesion of nucleated scale to the non-crosslinked omniphobic coating 108.

Another benefit of depositing $SiO_2$, glass or another oxide as an intermediary layer 104 for SOCAL bonding is the implications to corrosion prevention. The addition of the intermediary layer 104 not only acts to enable anti-scaling functionality, it also protects the substrate 106 from corrosion, depending on the electrochemistry of the flow. The coated substrate 102 developed here is solid-state, has similar or better anti-corrosion performance in comparison with lubricant-based approaches, and is more durable due to the elimination of lubricant drainage.

Durability testing of the coated substrates 102 is done by quantifying coating degradation at elevated temperatures, since fouling typically occurs in flow environments (e.g., heat exchangers) which have temperature (and solubility) gradients. The non-crosslinked omniphobic coating 108 is exposed to different temperature environments for various times. The results of the thermal stability tests are shown in FIGS. 7A and 7B. The SOCAL coating 108 starts to degrade at a temperature between 200° C. and 250° C., and more granular tests indicate that the critical temperature is approximately 230° C. These results are comparable to previous studies on thermal stability of PDMS. The high degradation temperature suggests potential use of components 100 comprising the coated substrates 102 in relatively low temperature applications (such as those using water as the working fluid), since excellent anti-fouling behavior is exhibited for extended time periods at temperatures lower than 230° C. In addition, a negligible change in wetting is observed after 1000 hours of exposure in a 100° C. ambient environment. Durability of any coating is key to long term utilization as it implies less maintenance required after deployment.

In addition to resistance to salt scaling, the developed SOCAL coating 108 has many other anti-fouling applications where elevated temperatures and non-aqueous working fluids dominate. For example, jet fuel fouling or coking is a significant problem encountered in the aviation and petrochemical industries. Kerosene, when under thermal stress, may decompose and create deposits on wetted materials. This phenomenon may cause many problems in aviation applications, given the use of jet fuel as an avionics coolant. Previous approaches to mitigate jet fuel deposition and breakdown include limiting the maximum wetted wall temperature and incorporating additives into the fuel. Limiting the maximum wetted wall temperature reduces overall aviation heat exchanger performance, requiring larger area and size to overcome the barriers. The coated substrate 102 developed here has the potential to migrate fuel deposition and facilitate collection of deposits downstream due to the reduced adhesion.

Figure 8:
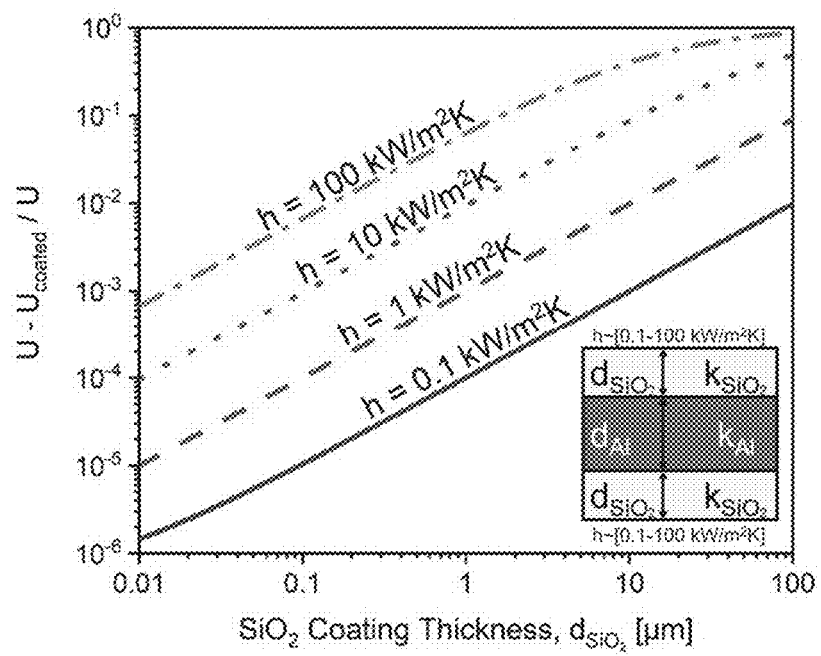
FIG. 8 shows conductance ratio $U-U_{coated}/U$, where U represents overall conductance, as a function of $SiO_2$ thickness ($d_{SiO2}$) for a variety of heat transfer coefficient (h) values, representative of both single and two-phase flows.

FIG. 8 shows conductance ratio $U-U_{coated}/U$, where U represents overall conductance, as a function of $SiO_2$ thickness ($d_{SiO2}$) for a variety of heat transfer coefficient (h) values, representative of both single and two-phase flows. Under exemplary realistic conditions, e.g., assuming ($d_{SiO2}$)=700 nm, h=3 kW/(m²·K) for a single-phase turbulent water flow, $U_{coated}/U \approx 0.998$, which indicates a 0.2% reduction in overall conductance. Given the ability to tailor the thickness of the $SiO_2$ layer, the analysis indicates that the thermal implications of the anti-fouling coated substrates developed here are negligible and well worth the benefit of added scale-reduction, which creates longer-term efficient heat transfer performance as well as reduced pressure drop and energy utilization.

The structure and properties of the coated substrates 102 have been described above. Also set forth in this disclosure is a method of forming the coated substrates 102. The method includes forming an intermediary layer 104 on a substrate 106 comprising a metal or alloy, and forming a non-crosslinked omniphobic coating 108 on the intermediary layer 104. The non-crosslinked omniphobic coating 108 is typically formed by dip-coating or another solution-based coating method. Any of a number of deposition methods, including dip coating, electrophoretic deposition, spin coating, physical vapor deposition (PVD), and others, may be employed to form the intermediary layer 104 on the substrate 106. Practically speaking, electrophoretic deposition and dip coating may be advantageous since they are well suited to coating large and complex-shaped components.

Figure 9:
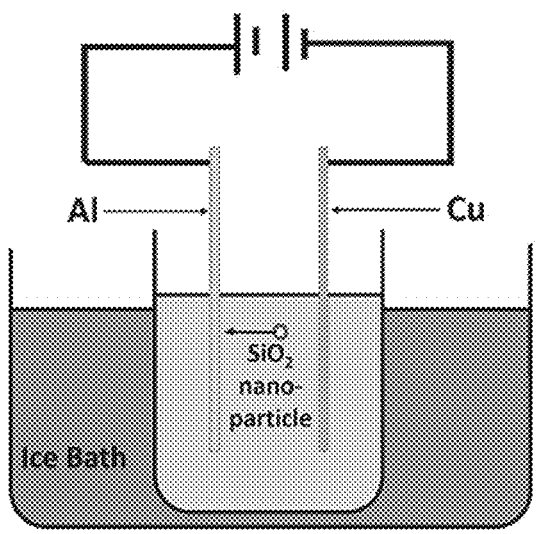
FIG. 9 is a schematic showing an exemplary electrophoretic deposition process for applying an intermediary layer (e.g., $SiO_2$) to a metal or alloy (e.g., aluminum) substrate.
Figure 10:
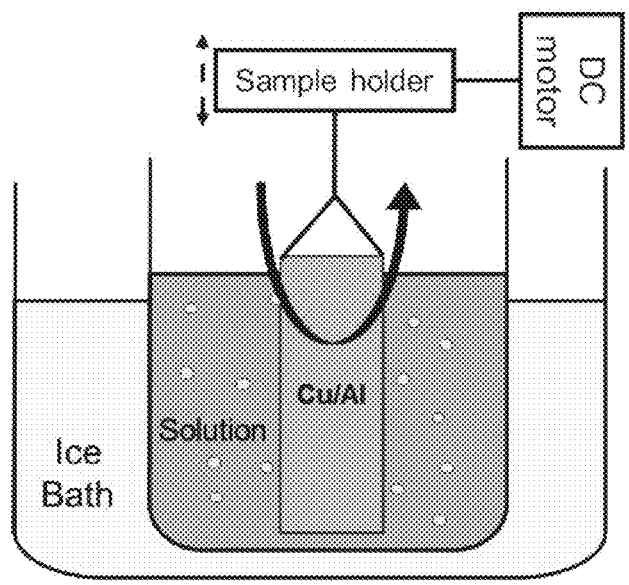
FIG. 10 is a schematic showing an exemplary dip coating deposition process for applying an intermediary layer to a metal or alloy substrate.

In electrophoretic deposition, the substrate 106, which is electrically conductive, functions as one of two electrodes spaced apart in a coating solution having a suitable composition. Upon application of a voltage to the electrodes, charged particles travel through the coating solution to the substrate to form a coating layer, as illustrated in FIG. 9, which upon drying and/or heat treating (e.g., sintering) becomes the intermediary layer 104. In dip coating, the substrate 106 is "dipped" or submerged into a coating solution of a suitable composition and withdrawn at a controlled rate, as shown in FIG. 10, to deposit on the substrate 106 a coating layer, which becomes the intermediary layer 104 upon drying and/or heat treating (e.g., sintering). The above-described heat treating or sintering may entail heating at 450-550° C. in a controlled environment (e.g., $N_2$ atmosphere). Another solution-based coating method is spin coating. In such solution-based coating methods to form the intermediary layer 104, which may comprise $SiO_2$, the coating solution may include tetraethyl orthosilicate (TEOS), methyltriethoxysilane (MTES) and/or methyltrimethoxysilane (MTMS) as solutes. The coating solution, which may be referred to as a sol-gel coating solution, may also include deionized water and ethanol.

In one example, a coating solution including a molar ratio of the TEOS to the MTES of about 1:1 may be suitable, e.g., for electrophoretic deposition. More specifically, the coating solution may include a molar ratio of water to ethanol to TEOS to MTES of about 19:19:1:1. Previously developed electrophoretic deposition coating solutions utilizing only TEOS as a solute resulted in rough surface finishes unsuitable for anti-fouling applications, and the inventors discovered that lowering the concentration of TEOS and adding MTES to the coating solution resulted in smoother coatings. The difference between TEOS and MTES is that one of the ethoxy groups is replaced by a methyl group. Thus, when gelation occurs, some of the Si—O—Si bonds can break because of the methyl group and finer control of generated particles may be achieved. The results of incorporating different MTES concentrations in the coating solution are shown by the SEM images of FIGS. 3A-3F, as discussed above, where FIGS. 3A-3C show results when the molar ratio of TEOS to MTES is 4:1, and FIGS. 3D-3F show the results when the molar ratio is increased to 1:1. Surface waviness is eliminated and aggregations appear from single and sporadic defect sites. Generally speaking, the TEOS: MTES molar ratio may be about 1:1, which may be understood to encompass TEOS:MTES molar ratios in a range from 1.3:1 to 1:1.3.

In another example, a coating solution including TEOS and MTMS may be used, e.g., for dip coating. A molar ratio of the TEOS to the MTMS in the coating solution may be 1:2.5 or about 1:2.5, which may be understood to encompass TEOS:MTMS molar ratios in a range from 1:2.8 to 1.3:2.5. In one example, the coating solution may include a molar ratio of water to ethanol to TEOS to MTMS of about 4.1:3:1:2.5. Thin (e.g., less than 10 microns) $SiO_2$ intermediary layers may be deposited on arbitrarily shaped metal substrates via dip coating. By controlling the velocity of the dip coating process, as described in the methods section below, it is possible vary the coating thickness without changing the sol-gel chemistry.

The non-crosslinked omniphobic coating 108 may comprise non-crosslinked PDMS, as mentioned above. In such an example, the non-crosslinked omniphobic coating 108 may be formed from a coating solution comprising a weight ratio of isopropanol to dimethyldimethoxysilane (DMDMS) to sulfuric acid of 100:20:1. Notably, the composition of the coating solution includes twice as much silane (DMDMS) than prior coating solutions applied to polished silicon wafers; this increase in the DMDMS is designed to ensure full coverage of the non-crosslinked omniphobic coating 108 over the intermediary layer 104, independent of the roughness level. Deposition of the non-crosslinked omniphobic coating 108 may utilize a suitable solution-based coating method, such as dip coating or spin coating.

Although demonstrated here primarily for aluminum substrates, the coating methodology may be extended to other metals and alloys having varying electrochemical activity. Alternative metal substrates may comprise, for example, copper (e.g., for HVAC & R), stainless steel (e.g., for food processing), titanium (e.g., for naval applications) or nickel superalloy (e.g., for aviation). Development of a universal coating methodology that can be applied on arbitrary surfaces has the potential to add significant value to industrial applications.

Exemplary Methods and Applications

SOCAL Coating: The SOCAL coating was originally designed for deposition on polished Si wafers using dip coating. In this example, the SOCAL solution includes a room temperature mixture of 100:10:1 wt. % isopropanol (IPA, CAS #: 67-63-0, Sigma Aldrich), dimethyldimethoxysilane (DMDMS, CAS #: 1112-39-6, Sigma-Aldrich) and sulfuric acid (CAS #: 7664-93-9, Sigma-Aldrich). DMDMS is added into IPA, followed by the addition of sulfuric acid in a cleaned and dry glass beaker. Once all chemicals are added to the beaker, the solution is vigorously stirred using a glass stick by hand for 30 seconds. After stirring, the solution is allowed to rest in a capped glass container for at least 20 minutes prior to use. The Si wafer is then vigorously rinsed for 30 seconds each in deionized water (DI water, CAS #: 7732-18-5, Sigma-Aldrich), IPA, acetone (CAS #: 67-64-1, Sigma-Aldrich), and then again in IPA. Immediately after rinsing, the Si wafer is dried in a clean nitrogen gas ($N_2$) stream. After drying, air plasma cleaning (HDC-001-HC, Harrick-Plasma) is performed at high power for 5 minutes to remove any remaining organic residue from the Si wafer surface. The cleaned Si wafer is then submerged in the quiescent SOCAL solution for 5-10 seconds and withdrawn gradually at a rate of ≈2 cm/s by hand. After removal, the edge of the sample is contacted gently with an absorbent paper towel (Brawny H700) to remove any excess solution via wicking, followed by leaving the sample to reside at room temperature for 20 minutes to ensure drying. Next, the sample is cleaned again using vigorous rinsing for 10 seconds each in DI water, IPA, toluene (CAS #: 108-88-3, Sigma-Aldrich), and again IPA. Finally, the sample is blown dry with a clean $N_2$ stream.

Application of the SOCAL coating on polished 6061 Al substrates (McMaster, 1651T3) utilizing the aforementioned recipe developed for Si wafers is found to result in poor coating performance. The coating efficacy is measured by the resulting water droplet contact angle hysteresis, defined as the difference between the apparent advancing and receding contact angles, which for successful SOCAL coating may not exceed 3° or 5°. When the same recipe is applied to polished Al samples, the resulting contact angle hysteresis exceeds 10°, indicating coating failure. To test whether roughness or surface chemistry are factors in coating failure, a thin (≈200 nm) layer of Al is sputter deposited on a clean polished Si wafer and then the aforementioned SOCAL coating method is repeated. Coating of SOCAL on an ultra-smooth mirror-finish Al interface yields similar results as obtained on bulk polished Al samples, mainly the unsuccessful deposition of SOCAL. It is hypothesized that the difference in hydroxyl group density of pristine $SiO_2$ interfaces compared to AlO(OH) interfaces results in the coating difference. This difference may also be responsible for the varying volatile organic compound dynamics that different metal oxides display. Indeed, the main factors to influence surface modification are believed to be: the concentration of surface hydroxyl groups, the type of surface hydroxyl groups present at the interface, the hydrolytic stability of the bond formed between the groups and the SOCAL molecules, and geometry and physical dimensions of the substrate. Hydroxyl-containing substrates vary widely in concentration and type of hydroxyl groups present, with glass or silica being two of the best substrate materials for surface modification when compared to Al. Given this result, $SiO_2$ is deposited on Al substrates prior to SOCAL coating. This forms a sandwich structure with three layers (Al—$SiO_2$-SOCAL), where the $SiO_2$ layer may be deposited by different methods. On all intermediary layers, EPD, PVD and SOG, the silane concentration is doubled, i.e. SOCAL solution used for these samples is a mixture of 100:20:1 wt. % isopropanol, dimethyldimethoxysilane and sulfuric acid. Doubling of the silane concentration is done since the original recipe used an atomically smooth polished Si wafer as the substrate. Since some roughness is present on the fabricated samples, the silane dosage is increased in case the initial recipe lacks the concentration to achieve full coverage.

Aluminum Substrate Preparation and Electrophoretic Deposition (EPD): Aluminum tabs (Polished 6061 Al, McMaster) are cut in 2.5 cm×8 cm×0.2 cm sizes on a conventional mill to serve as the substrates for coating. After cutting, the protective adhesive tape on the polished side is peeled off, resulting in remnants of adhesive residue. To remove the adhesive residue, a commercial grease remover (Orange Blast, Greased Lightning) is used. Briefly, the Al tabs are sprayed with the grease remover, followed by vigorous rubbing on the polished surface using a soft sponge (Non-scratch, Scotch Bright), followed by vigorous rinsing in room-temperature laboratory tap water. The samples are then rinsed for 10 seconds in DI water, followed by IPA, followed by $N_2$ drying, and air plasma cleaning at high power for 5 minutes as described above.

In the original EPD coating recipe, the molar ratio of TEOS:water:ethanol is 0.2:10:10, respectively. The water is adjusted to pH=11.7 by the addition of $NH_4OH$. This recipe is herein referred to as the "initial recipe." The modified recipe is prepared as follows. An EPD solvent is made using a 1:1 molar ratio of DI water and ethanol (CAS #: 64-17-5, Sigma-Aldrich). Prior to mixing the solvent, the DI water is modified to a pH of 13 by adding sodium hydroxide (NaOH, CAS #: 1310-73-2, Sigma-Aldrich) and vigorously mixing at room temperature using a glass stick to dissolve the NaOH. The EPD solute is made using a 1:1 molar ratio of tetraethyl orthosilicate (TEOS, CAS #: 78-10-4, Sigma-Aldrich) and triethoxymethylsilane (MTES, CAS #: 2031-67-6, Sigma-Aldrich). The molar ratio of solvent and solute is 19:1. The final molar ratio of water:ethanol:TEOS:MTES is 19:19:1:1. The TEOS and MTES are mixed in a glass beaker by with a PTFE stir bar on hot plate rotating at 200 rpm. The entire beaker with solute is kept in an ice water bath in order to maintain a temperature of 0° C. The solvent is then slowly added to the solute with continual stirring by the PTFE stir bar. The complete solution is kept in the ice bath during the entire EPD procedure.

After the polished Al sample (substrate) is cleaned by air plasma, it is immediately (within 30 seconds) placed in the EPD coating solution as the anode. A copper (Cu, 110 Copper, McMaster) tab having the same size as the polished Al tab acts as the cathode. The two tabs are separated by a 1 cm gap using a 3D printed (TAZ 6, LulzBot) cap. The polished side of the Al anode is placed such that it faces the Cu cathode. The negatively charged $SiO_2$ particles in the solution are driven to the polished Al plate by an applied voltage generated by a power supply (GW Instek PSW800-1.44) connected between the two tabs. The power supply is set to run with a constant current density of 2.2 $mA/cm^2$ during the 10 minutes deposition process. The voltage is subject to change to maintain the constant current density and is observed to range from ≈10 V to ≈200 V. By altering the current density and deposition time, different thicknesses of $SiO_2$ may be obtained. A 150 mL PYREX beaker is used in the experiment. The amount of the EPD solution is carefully calculated prior to deposition; hence, the depth of solution is 5±0.1 cm as measured to the bottom of the meniscus. Since the power supply is able to maintain a constant current, and the width of the sample is 2.5 cm, it is possible to ensure that the area immersed in solution is exactly 2.5 cm×5 cm; hence the current density may be controlled. The effect of changing the ratio between the solvent and solute to find an optimum ratio for smooth deposition of $SiO_2$ is explored. Detailed diagrams along with photographs of the EPD process and setup are shown in FIG. 2. The final thickness of the intermediary coating is measured by focused ion beam milling to be $d_{SiO2} \approx 700$ nm.

After completing the EPD process in the coating solution, the Al tab (substrate) is carefully withdrawn from the coating solution and rinsed gently for 15 seconds with a 1:1 molar ratio of DI water and ethanol. The sample is then dried by gently touching the bottom of the sample on an absorbent paper towel to wick away excess solution, and then allowed to dry at room temperature for 10 minutes. The coated Al substrate is then sintered in an atmospheric pressure oven (Lindberg/Blue M Moldatherm Box Furnace) at 500° C. for 30 min to yield an $SiO_2$ intermediary layer on the aluminum substrate. The ramp speed is 8° C./min. Finally, the Al substrate including the EPD $SiO_2$ intermediary layer is coated with the non-crosslinked omniphobic (SOCAL) coating. The same procedure developed for the polished Si wafer is used with double the silane concentration, as discussed above.

To obtain a benchmark comparison with the SOCAL coating, highly scalable superhydrophobic Al surfaces are fabricated using silanization of boehmite. A detailed description of the superhydrophobic Al surface fabrication can be found elsewhere and is known in the art. As a second surface that is smooth and has ultra-low contact angle hysteresis, a copper-based lubricant infused surface (LIS) is fabricated for benchmarking anti-fouling performance. A detailed description of the LIS fabrication method used can be found in other literature and is known in the art.

Spin on Glass (SOG) Coating Deposition: Another method studied for depositing $SiO_2$ is SOG or spin coating. A commercial SOG kit (NDG-0500, DesertSilicon) is used. The Al tabs (substrates) are prepared and cleaned using the same procedure as with EPD. The only difference is the size of Al tabs, which for SOG is 2.5 cm×5 cm×0.2 cm. The Al tab is placed on a spin coater (Spin 1200T, MIDAS) and coated with the NDG-0500 solution. Since the sample is rectangular in shape, to ensure smooth and full coverage, redundant solution is applied on top of the Al tab. The spin coater is programmed to accelerate to 3000 rpm in 10 seconds, stay at 3000 rpm for 30 seconds, and decelerate to 0 rpm in 10 seconds. The thickness of the coating is controlled by the spin speed, with detailed relations provided by DesertSilicon. 3000 rpm is used to achieve a 50 nm thick glass coating. After spin coating, the tab is sintered in an atmospheric pressure oven (Lindberg/Blue M Moldatherm Box Furnace) at 600° C. for 30 min. Finally, the Al substrate coated with the SOG $SiO_2$ intermediary layer is coated with non-crosslinked omniphobic (SOCAL) coating. The same procedure developed for the polished Si wafer is used with double the silane concentration, as discussed above.

Sputter Deposition (PVD): Silicon dioxide ($SiO_2$) sputtering or physical vapor deposition (PVD) is done on a commercial sputter system (AJA Orion 3). Prior to sputtering, the cleaned and dried polished Al tabs (substrates) are further cut to 2.5 cm×5 cm×0.3 cm sizes to ensure full coverage. The Al substrates are cleaned using the previously discussed procedure outlined in the EPD section. During sputter deposition, the plasma chamber is first evacuated to $4 \times 10^{-4}$ Pa, with an argon (Ar) flow rate set to 8.9 mg/min. A radiofrequency (RF) plasma is initiated at 5 W power. Once the sputter deposition process starts, the RF power is increased to 200 W. The estimated deposition rate of $SiO_2$ is $\approx 0.1$ angstroms per second. The total deposition time is 25 minutes; hence the total thickness of the $SiO_2$ coating is $\approx 15$ nm. After completing sputter deposition of $SiO_2$, the non-crosslinked omniphobic (SOCAL) coating is applied using the same procedure developed for the polished Si wafer with double the silane concentration.

Dip Coating: To prepare a sol-gel solution for dip coating, tetraethyl orthosilicate (TEOS, CAS #: 78-10-4, Sigma Aldrich) and trimethoxymethylsilane (MTMS, CAS #: 1185-55-3, Sigma Aldrich) are mixed in a glass beaker in a 1:2.5 molar ratio or another desired molar ratio. The beaker is placed in an ice bath and stirred for 5 minutes using a magnetic stirrer. Sodium hydroxide (CAS #: 1310-73-2) is mixed with DI water to adjust the pH of the resultant solution to 14.5, and it is added as a catalyst to the silane solution with continual stirring. Ethanol (CAS #: 64-17-5, Sigma Aldrich) is added as the solvent and stirring continues for another 10 minutes. The molar ratio of TEOS:MTMS:DI:ethanol is 1:2.5:4.1:3 in this example. The solution is kept in an ice bath throughout the dip coating method. The Cu and Al samples are coated immediately after the cleaning process to eliminate hydrocarbon adsorption from the ambient. The samples are held by a clamp and vertical motion is controlled by a dc motor, as shown in FIG. 10. The velocity of the dip coating is controlled by the applied voltage to the dc motor. The thickness of the coating is adjusted by changing the sample withdrawal velocity. In one example, the withdrawal velocity is kept at 17.1 cm/min to obtain a constant coating thickness for all samples. The thickness is measured to be $3 \pm 0.1$ µm using ellipsometry (J.A. Woollam VASE). After sol-gel coating, the samples are left to dry at room temperature for 10 minutes and then are further heat treated at 500° C. for 30 minutes in a nitrogen furnace (Lindberg 2" tube furnace) in order to ensure sintering and densification of the $SiO_2$ coating.

Contact Angle Measurement: To characterize the surface chemistry of the SOCAL coated samples, both apparent advancing (ACA) and receding (RCA) contact angles are measured using a microgoniometer (MCA-3, Kyowa Interface Science). Samples are placed on a temperature-controlled stage having a chiller feedback loop (AD20R-30-A11B, PolyScience). Two sets of contact angle data are measured, at sample temperatures of $20 \pm 2°$ C. and $60 \pm 5°$ C. Samples characterized at higher temperatures are conducted one minute after placement on the stage to allow for temperature equilibration. The sample surface temperature is measured using an infrared thermometer (Helect) having an uncertainty of $\pm 2$ C. A piezoelectric dispenser is set 5 to 10 mm above the sample surface. The dispenser can dispense microscale droplets on the surface, allowing droplets to accumulate into a larger droplet for contact angle characterization. After obtaining the water droplet ACA at 20° C. sample temperatures with a water droplet dispense rate of 150 Hz, the dispenser is shut off, allowing the water droplet to evaporate and measure the RCA. For tests conducted at 60° C. sample temperatures, the dispense rate is increased to 300 Hz during ACA measurement since the sessile water droplet evaporates faster. Due to rapid evaporation, the dispenser is kept on during the RCA measurement with a reduced frequency of 50 Hz. All samples are characterized by conducting and averaging the data from at least 5 independent ACA and RCA measurements on spatially varying locations. All contact angle data are analyzed using the image processing software (FAMAS, interFAce Measurement and Analysis System) with the circle fitting method.

Scaling Testing: Scaling testing is performed in a custom-built setup. A $CaSO_4$ solution is made by first pouring 700 mL of DI water in a 1000 mL glass beaker, followed by addition of 0.42 g of $CaSO_4$ salt, and vigorous mixing using a PTFE stir bar at 600 rpm for 1 hour or until salt is fully dissolved at room temperature. The samples of interest are then immersed in the $CaSO_4$ aqueous solution (0.06 g/100 mL) at a 70° angle relative to the vertical. A custom 3D printed rack (TAZ 6, LulzBot) is used to support each sample. To secure the samples, the back side of the sample is adhered to the rack using double sided tape (3M Scotch, double sided mounting tape) sized to cover the entire back side of each sample. The beaker is then placed on a hot plate (UX-04600-12, Thermo Scientific) and heated to 65° C. As the water gradually evaporates from the beaker, $CaSO_4$ precipitation forms on the sample. To characterize scaling, samples are weighed before and after experiments on a microbalance (AS 82/220.R2, Radwag) having a maximum resolution of 0.01 mg and an uncertainty of ±0.01 mg. Since the backside of the sample is taped, scaling occurring only on the front side is observed. This is backed by visual and optical microscopy inspection of samples after removing them carefully from the holder. Since the shape of the Si wafer samples are semicircles, while the Al samples are rectangular, the weight added due to scale formation is reported in terms of normalized front facing area, or $mg/cm^2$.

To understand the mechanism of scaling from bulk precipitation without the potential presence of liquid-vapor menisci, as well as sample orientation, the same scaling test as described above is conducted with samples laid flat on the bottom of the beaker (coating facing up). In this horizontal configuration, all samples may be covered with precipitation, since all solvent will eventually evaporate. To characterize surface coverage, photographs of the salt nucleated on the tops of surfaces are obtained using both a DSRL camera (5D mark IV, Canon) as well as optical microscopy (ECLIPSE LV100ND Nikon) with a microscope camera (DS-Qi2, Nikon).

De-Scaling Testing: De-scaling is characterized for all samples. 500 mL $CaSO_4$ aqueous solutions having $CaSO_4$ concentrations of 0.2 g/100 mL are synthesized. Uncoated Al, glass coated Al, and SOCAL coated Al samples are studied. The glass coated and SOCAL coated Al used the SOG method to create the glass layer. Each coating type has two samples per run to ensure repeatability and consistency. Sample locations are positioned such that flow inhomogeneity may be factored into the analysis of results, with one sample closer to the center of the circular beaker, and the second closer to the edge. Samples are placed at the bottom of the beaker with the coating side facing up, and a PTFE stir bar at the center to control flow conditions. The hotplate is kept at 65° C. and the stir bar is operated at 300 rpm. To make sure all samples are covered with salt, the water is allowed to completely evaporate from the beaker. After taking photographs with a DSLR camera (5D mark IV, Canon) of the scaled samples, 300 mL of pure DI water is added into the beaker to initiate de-scaling. The speed of the stir bar is set to 500 rpm to increase the flow of DI water and to ensure dissolution of the scale product. Photographs are taken in 30 second intervals during stirring.

Thermal Stability Testing: The thermal stability of the SOCAL coatings is tested by heating samples in an atmospheric pressure oven (Lindberg/Blue M Moldatherm Box Furnace) for various time and temperature combinations. After heating, the apparent water droplet advancing and receding contact angles are measured using the microgoniometer. The heating temperature ranges from 150° C. to 400° C., and is varied in 50° C. intervals. At each temperature, five identical samples are placed in the oven. After 1 hour, the first sample is taken out, followed by the rest of the samples taken out sequentially at 2, 4, 8, and 16 hours. Change in apparent contact angle is used as an indicator of coating integrity due to the intrinsic wettability of the $SiO_2$ coated substrate beneath the SOCAL coating.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the disclosure. Thus, it should be understood that although the present disclosure has been specifically disclosed by preferred embodiments, exemplary embodiments and optional features, modification and variation of the concepts herein disclosed may be resorted to by those skilled in the art, and that such modifications and variations are considered to be within the scope of this disclosure as defined by the appended aspects. The specific embodiments provided herein are examples of useful embodiments of the present disclosure and it will be apparent to one skilled in the art that the present disclosure may be carried out using a large number of variations of the devices, device components, methods steps set forth in the present description. As will be obvious to one of skill in the art, methods and devices useful for the present methods can include a large number of optional composition and processing elements and steps.

Every formulation or combination of components described or exemplified herein can be used to practice the disclosure, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the aspects herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the aspect element. As used herein, "consisting essentially of" does not exclude materials or steps that do not materially affect the basic and novel characteristics of the aspect. In each instance herein any of the terms "comprising", "consisting essentially of" and "consisting of" may be replaced with either of the other two terms. The disclosure illustratively described herein suitably may be practiced in the absence of any element or elements, limitation or limitations which is not specifically disclosed herein.

Although the present disclosure has been described with reference to certain embodiments thereof, other embodiments are possible without departing from the present disclosure. The spirit and scope of the appended aspects should not be limited, therefore, to the description of the preferred embodiments contained herein. All embodiments that come within the meaning of the aspects, either literally or by equivalence, are intended to be embraced therein. Furthermore, the advantages described above are not necessarily the only advantages of the disclosure, and it is not necessarily expected that all of the described advantages will be achieved with every embodiment of the disclosure.

The invention claimed is:

1. A coated substrate comprising:
   a substrate comprising a metal or alloy;
   an intermediary layer formed on the substrate;
   a non-crosslinked omniphobic coating formed on the intermediary layer,
   wherein the substrate is part or all of a heat exchanger, and
   wherein the non-crosslinked omniphobic coating has a thickness in a range of from about 1 nm to about 10 nm.

2. The coated substrate of claim 1, wherein the metal or alloy is selected from the group consisting of: aluminum, copper, stainless steel, titanium, and nickel superalloy.

3. The coated substrate of claim 1, wherein the intermediary layer comprises a glass, $SiO_2$ and/or $Al_2O_3$.

4. The coated substrate of claim 1, wherein the intermediary layer has a root mean square roughness $R_q$ of about 50 nm or less.

5. The coated substrate of claim 4, wherein the root mean square roughness $R_q$ is about 5 nm or less.

6. The coated substrate of claim 1, wherein the intermediary layer comprises a thickness in a range from about 0.5 micron to about 4 microns.

7. The coated substrate of claim 1, wherein the non-crosslinked omniphobic coating comprises non-crosslinked polydimethylsiloxane (PDMS).

8. The coated substrate of claim 1, wherein the non-crosslinked omniphobic coating comprises a surface energy of about 15 $mJ/m^2$ or less.

9. The coated substrate of claim 8, wherein the surface energy is in a range from about 9 $mJ/m^2$ to about 13 $mJ/m^2$.

10. The coated substrate of claim 1 comprising a contact angle hysteresis of about 5° or less with respect to deionized water.

11. The coated substrate of claim 1, wherein scale formed on the non-crosslinked omniphobic coating is removable by rinsing with water.

12. A thermal component comprising the coated substrate of claim 1 for use in water treatment, power generation, petroleum refining, food processing, aviation, naval applications, and/or heating, ventilation, air conditioning and refrigeration (HVAC-R) systems.

* * * * *